(12) United States Patent
Martin et al.

(10) Patent No.: US 7,197,735 B2
(45) Date of Patent: Mar. 27, 2007

(54) FLOORPLAN VISUALIZATION METHOD USING GATE COUNT AND GATE DENSITY ESTIMATIONS

(75) Inventors: Gregor J. Martin, Mountain View, CA (US); Ying Chun He, Milpitas, CA (US); Grant Lindberg, Pleasanton, CA (US)

(73) Assignee: LSI Logic Corporation, Milpitas, CA (US)

( * ) Notice: Subject to any disclaimer, the term of this patent is extended or adjusted under 35 U.S.C. 154(b) by 149 days.

(21) Appl. No.: 11/012,741

(22) Filed: Dec. 15, 2004

(65) Prior Publication Data

US 2006/0129963 A1 Jun. 15, 2006

(51) Int. Cl.
*G06F 17/50* (2006.01)

(52) U.S. Cl. .............................. 716/8; 716/11; 716/12

(58) Field of Classification Search .................... 716/1, 716/8, 11, 12, 18
See application file for complete search history.

(56) References Cited

U.S. PATENT DOCUMENTS 6,968,514 B2 * 11/2005 Cooke et al. .................. 716/1

* cited by examiner

*Primary Examiner*—Thuan Do
(74) *Attorney, Agent, or Firm*—Christopher P. Maiorana, P.C.

(57) ABSTRACT

A method for floorplan visualization comprising the steps of (A) receiving design information for an integrated circuit design comprising one or more subsystems, (B) generating one or more gate count estimates for the one or more subsystems of the integrated circuit design, (C) generating one or more gate density estimates for gates of the one or more subsystems mapped to one or more programmable areas of a programmable platform device and (D) generating a visual representation of one or more area estimations for each of the one or more subsystems based on the one or more gate count estimates and the one or more gate density estimates.

27 Claims, 5 Drawing Sheets

30,000 GATE SUBSYSTEM DESIGN WITH INITIAL UTILIZATION COEFFICIENT OF 10,000 GATES/MM$^2$ HAS AN INITIAL AREA OF 3MM$^2$

WHEN ASPECT RATIO IS CHANGED TO LONG AND THIN, UTILIZATION COEFFICIENT MAY CHANGE RESULTING IN INCREASED AREA (E.G., 3.1MM$^2$) FOR THE SUBSYSTEM.

20,000 GATE SUBSYSTEM DESIGN WITH INITIAL UTILIZATION COEFFICIENT OF 10,000 GATES/MM² HAS AN INITIAL AREA OF 2MM²

WHEN BLOCK_1 AND BLOCK_3 ARE PLACED ON EITHER SIDE OF BLOCK_2, THE UTILIZATION COEFFICIENT MAY CHANGE RESULTING IN INCREASED AREA FOR BLOCK_2.

FLOORPLAN VISUALIZATION METHOD USING GATE COUNT AND GATE DENSITY ESTIMATIONS

FIELD OF THE INVENTION

The present invention relates to Very Large Scale Integrated (VLSI) circuit design technology generally and, more particularly, to a floorplan visualization method and/or tool.

BACKGROUND OF THE INVENTION

High-level analysis of physical design planning covers the allocation of input/outputs (IOs), diffused memories and location of R-cell memories within integrated circuit designs based on programmable platform devices, such as platform and structured application specific integrated circuits (ASICs). In a conventional design flow a designer decides: (i) where to place IOs, (ii) how to assign functional memories to diffused memories, and (iii) where to place R-cell memories. The decisions are made without the designer being able to see the various subsystems (blocks) and memory topology of the design. The designer typically guesses (or estimates) a size for each subsystem. Assignment and placement decisions are made based on the guess/estimate of the designer.

It is difficult for a designer, especially a novice one, to visualize how big each subsystem is in order to judge the optimum location and allocation for the subsystems. A bad assignment can be difficult to recognize because the effects are subtle (e.g., bad timing paths, congestion, etc.) and not always distinguishable from non-placement related issues. Conventional solutions involve either (i) the designer (or engineer) using his/her experience and design knowledge to place and assign the subsystems or (ii) a full floorplanning analysis that uses actual netlist data and actual cell area in a professional floorplanning tool.

The conventional solutions are unacceptable for two reasons. Relying on the designer to use experience and design knowledge to place and assign subsystems is not desirable because the engineer, even with expertise, can easily mis-estimate the layout and obtain sub-optimal results without being able to identify that the IO and memory allocation/placement played a role. Performing a full floorplanning analysis with actual netlist data and actual cell area data is only practical for application specific integrated circuit (ASIC) designs where a great deal of time is available to do full floorplanning. Also, the full floorplanning tools are very expensive and slow. The full benefit of full floorplanning is only realized with ASIC designs where the designer has full control over diffused memory placement. For designs involving programmable platform devices, a full floorplanning analysis is not practical because the floorplanning tools can cost many times more than the entire engineering costs for the designs.

It would be desirable to have a floorplan visualization method and/or tool that does not have the disadvantages of the conventional solutions.

SUMMARY OF THE INVENTION

The present invention concerns a method for floorplan visualization comprising the steps of (A) receiving design information for an integrated circuit design comprising one or more subsystems, (B) generating gate count estimates for the one or more subsystems of the integrated circuit design, (C) generating one or more gate density estimates for gates of the one or more subsystems mapped to one or more programmable areas of a programmable platform device and (D) generating a visual representation of one or more area estimations for each of the one or more subsystems based on the one or more gate count estimates and the one or more gate density estimates.

The objects, features and advantages of the present invention include providing a floor plan visualization method and/or design tool that may (i) allow placement analysis and visualization, (ii) help with selection of programmable devices, (iii) facilitate IO assignment, diffused memory assignment and R-cell memory placement, (iv) provide a fast and easy analysis, (v) allow evaluation of more permutations than would be possible with a full layout tool, (iv) allow layout analysis very early in a design flow, (vii) be easily implemented and/or (viii) provide a low cost, or no cost, addition to existing design tools.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
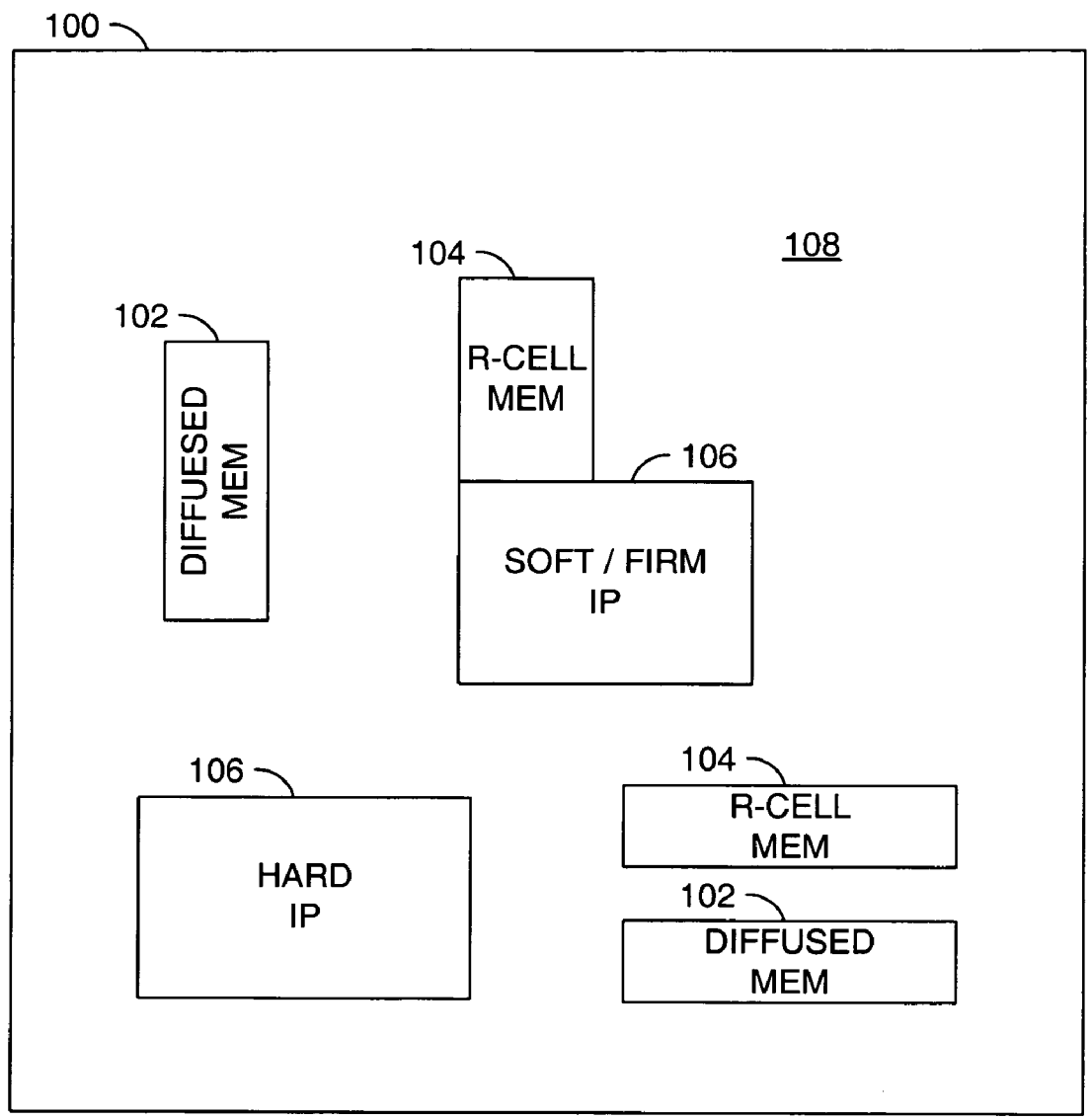
FIG. 1 is a block diagram illustrating an example programmable platform device.

Referring to FIG. 1, a block diagram of a programmable platform device (or die, or slice) 100 is shown in accordance with a preferred embodiment of the present invention. The slice 100 may be implemented, in one example, as a partially manufactured semiconductor device in which all of the silicon layers have been fabricated and customization may be performed via one or more metal layers. In one example, the slice 100 may comprise one or more regions of diffused memory 102, one or more regions of R-cell memory 104, one or more IP (intellectual property) blocks 106 and a diffused region 108. In another example, multiple diffused regions 108 may be implemented. The regions 102, 104, 106, and 108 may be distributed around the slice 100. The diffused memory 102 and hard (diffused) IP 106 regions are generally fixed. Other blocks (e.g., PLLs, IOs, etc.) may be implemented in a slice to meet the design criteria of a particular application.

In one example, a number of slices 100 may be fabricated having different varieties and/or numbers of IP blocks, diffused memories, etc. By fabricating a variety of slices with a variety of IP blocks and diffused memories, a wide variety of applications may be supported. For example, a particular slice may be selected for customization because the particular IP blocks implemented are suitable for a customized application.

The IP blocks 106 may comprise, for example, hard IP, soft IP and/or firm IP. Hard IP may be diffused at optimal locations within a slice using cell-based elements for maximum performance and density (e.g., embedded processors, transceivers, etc.). Soft IP may be incorporated into a slice as a function block. Soft IP may be implemented in similarly to other blocks in a design (e.g., with specific timing criteria to ensure functionality). Firm IP generally allows fully routed and characterized high-performance blocks to be implemented in a slice design.

In one example, the IP blocks 106 may be implemented similarly to an ASIC design. In general, the IP blocks 106 may be configured to provide a number of functions on the slice 100. For example, the IP blocks 106 may comprise phase locked loops (PLLs), instances of processors, input/output PHY level macros, etc. Soft and firm IP blocks may be implemented in the diffused region(s) 108.

The regions 108 may be customized, in one example, as logic and/or memory. For example, the regions 108 may be implemented as a sea of gates array. In one example, the regions 108 may be implemented as an R-cell transistor fabric comprising a number of R-cells. As used herein, R-cells generally refer to an area of silicon designed (or diffused) to contain one or more transistors that have not yet been personalized (or configured) with metal layers. Wire layers may be added to the R-cells to make particular transistors, logic gates, soft and firm IP blocks and/or storage elements. For example, the R-cell memories 104 may be non-diffused memory built out of the programmable R-cells in the R-cell transistor fabric 108. The present invention may be configured to determine the placement of (i) the R-cell memories 104 and (ii) the soft and/or firm IP blocks 106.

An R-cell generally comprises one or more diffusions for forming the parts of N and/or P type transistors and the contact points where wires may be attached in subsequent manufacturing steps (e.g., to power, ground, inputs and outputs). In general, the R-cells may be, in one example, building blocks for logic and/or storage elements (e.g., the R-cell memories 104). R-cells may be diffused in a regular pattern throughout a slice. For example, one way of designing a chip that performs logic and storage functions may be to lay down numerous R-cells row after row, column after column. A large area of the chip may be devoted to nothing but R-cells. The R-cells may be personalized (or configured) in subsequent production steps (e.g., by depositing metal layers) to provide particular logic functions. The logic functions may be further wired together (e.g., a gate array design).

Figure 2:
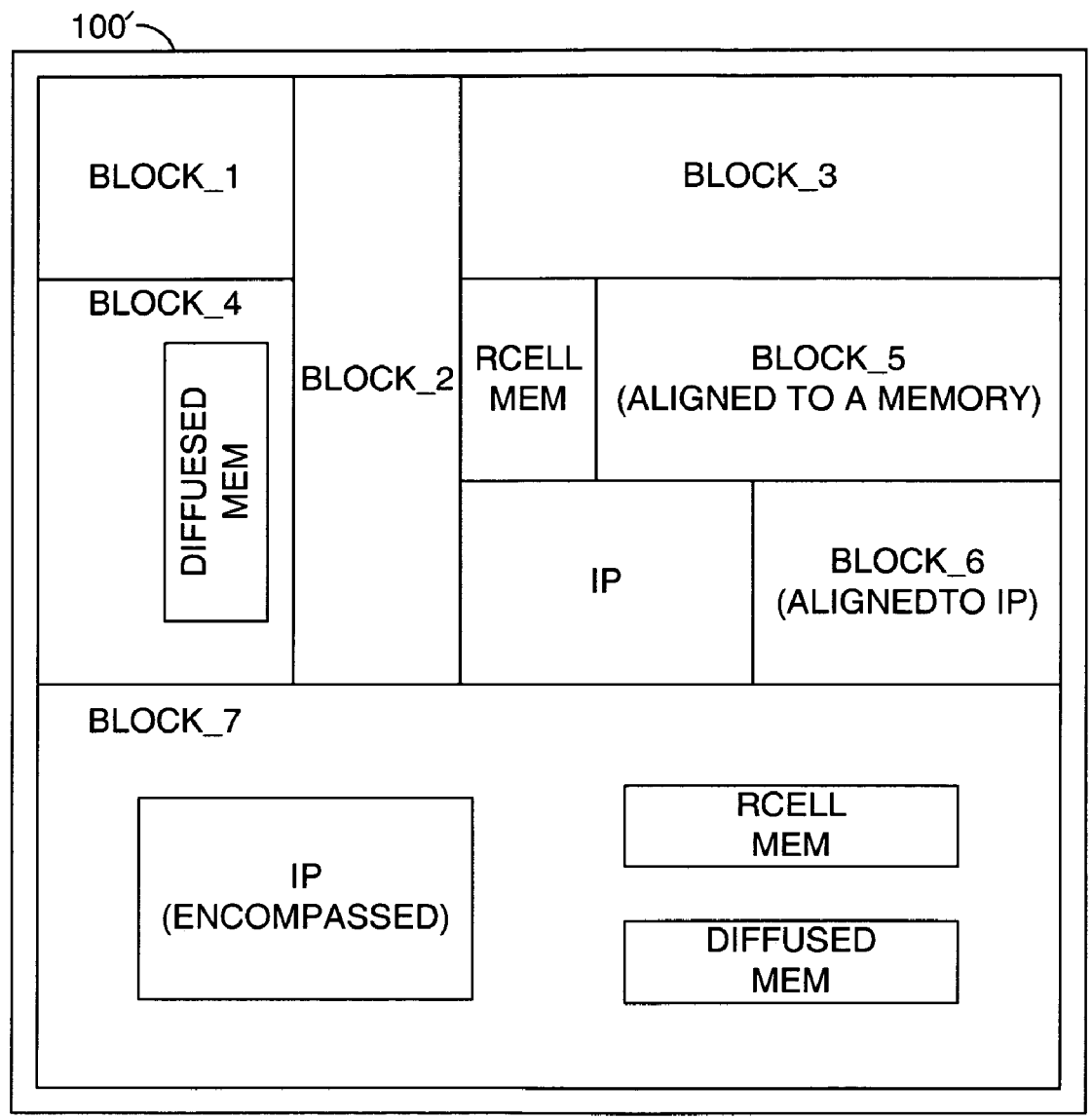
FIG. 2 is a block diagram illustrating an example floorplan visualization in accordance with the present invention.

Referring to FIG. 2, a block diagram is shown illustrating an example floorplan visualization in accordance with a preferred embodiment of the present invention. A design tool (or flow) implementing the present invention may provide a floorplan visualization of a design mapped and overlaid onto, for example, a slice 100'. The floorplan visualization in accordance with the present invention generally provides a designer with a visual representation illustrating placement and allocation of subsystems (e.g., BLOCK_1, BLOCK_2, . . . , BLOCK_7, etc.) of a design with respect to resources of the slice 100' (e.g., the diffused memories 102, R-cell memories 104, IP blocks 106, etc.). The floorplan visualization is generated based on gate count estimates and gate density estimates.

An initial logic synthesis run may be performed to generate gate count estimates for each subsystem (or block) of a design. For any given technology, the density of gates may be estimated as mapped to R-cells of the programmable platform device 100'. The gate count estimates and the gate density estimates may be used to estimate the area on the programmable platform device (or slice) 100' that each subsystem of the design may occupy.

A tool implementation in accordance with the present invention may use the area estimate information to generate an overlay representing the area estimation for each subsystem. The overlay may be displayed on top of a representation of any chosen slice. The tool may be further configured to allow the visual representations of each subsystem to be moved around to fit within the floorplan of the programmable platform device 100'. The present invention generally allows designers to better visualize a design and make better placement decisions. The present invention generally provides a visual representation of the estimated area to which each subsystem of a design maps for the given slice/technology rather than a "real" floorplan. Once the designer has decided on an optimal floorplan (or layout), the designer may use the tool to determine the best assignment for IOs and diffused memories as well as the best location for R-cell memories. The graphical representation generally provides the designer with information for making the best assignments for the design.

In general, the tool does not show the real (or actual) gate area. Rather, the tool presents an estimated area that equates approximately to the area each subsystem will take up on the final device. The present invention generally provides a purely visual/graphical representation, without requiring all of the real implementation/physical data. In general, only the gate count estimates and gate density estimates (e.g., gate count to area of R-cells ratio) are utilized.

In one example, the tool may represent each block as a movable rectangle (or other non-rectangular polygon) that fits within the slice boundaries. In one example, the area of each subsystem (or block) may remain constant. However, a shape of each block may be manipulated by the designer. For example, a block may be made longer and thinner, or shorter and fatter, to fit within a particular (or available) space. In general, the total area used by a subsystem may remain substantially constant.

In another example, a block may be allowed to flow around, or encompass diffused components. For example, when a subsystem uses a diffused memory, the representation related to the subsystem area may include properties (or parameters) that may be set such that the subsystem sits along side another block of the programmable platform device 100'. For example, a subsystem representation may be aligned with an IP block 106 (e.g., BLOCK_6) or an R-cell memory (e.g., BLOCK_5). The properties may also be set to allow the subsystem area representation to encompass other blocks (e.g., BLOCK_4 and BLOCK_7). As long as the area of the subsystem remains substantially constant regardless of shape, the estimated area of R-cells allocated for each subsystem may be correctly maintained.

In another example, the shape and/or placement of subsystems may affect the gate count to area of R-cells ratio. The effect may be represented by refining (or adjusting) a parameter (e.g., utilization coefficient). The utilization coefficient for a subsystem may be used to adjust area representations presented in accordance with a preferred embodiment of the present invention.

In general, a tool implemented in accordance with the present invention allows each block representing a subsystem to be fluid (e.g., easily adjusted in shape, placement, etc.). The designer may easily and quickly rearrange the layout to try "what if" analysis. For example, the designer may quickly and easily determine the effect of reshaping regions, moving regions around on the slice and/or completely rearranging the layout.

In one example, the present invention may provide a tool that may allow the designer to look at subsystems at any level of the design hierarchy. For example, the size and placement of blocks at any level of hierarchy within the design may be analyzed and visual representations presented accordingly.

Because the hierarchy and design content are generally known after synthesis, the tool in accordance with the present invention may also visually represent the diffused IP blocks 106. In one example, rules may be implemented to snap (or attach) subsystem blocks that contain (or are aligned with) IP to the particular IP. The tool may also be configured to snap (or align) the subsystems to memories at the respective places in a design (e.g., BLOCK_5).

Figure 3:
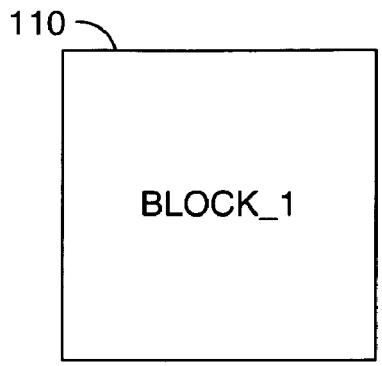
FIG. 3 is a block diagram illustrating effects of shape on subsystem area.
Figure 3:
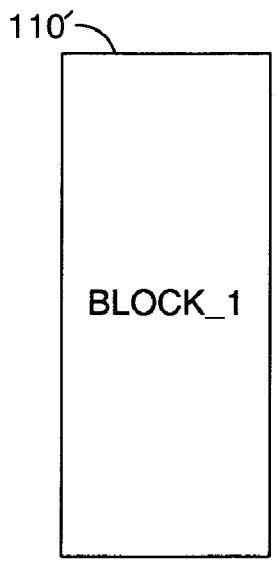

Referring to FIG. 3, a block diagram is shown illustrating an effect of subsystem shape on estimated area. The area occupied by each subsystem may be dependent upon the utilization coefficient. Each block (or region) may have an independent utilization coefficient based on, for example, a proportion of logic to flops. For example, the estimated area representing the subsystem block may be determined based on the utilization coefficient, the gate count estimation, and any other factors that may affect the utilization coefficient.

The utilization coefficient, and therefore subsystem area, may be adjusted (or refined) to dynamically represent the effects that subsystem shape may have on the utilization coefficient. Particular shapes (e.g., long and skinny) may have a lower utilization coefficient than other shapes (e.g., square). For example, a subsystem (e.g., the BLOCK_1) may have a given number of gates that may be implemented in a square area 110 (e.g., three square units). However, when the shape of the subsystem is changed to a rectangular shape 110' the subsystem may occupy a larger area (e.g., 3.1 square units). In one example, the tool implemented in accordance with the present invention may be configured to increase the total area occupied by a displayed subsystem to reflect the lower utilization coefficient for the particular shape.

Figure 4:
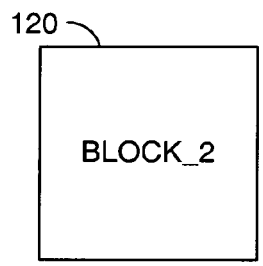
FIG. 4 is a block diagram illustrating effects of placement on subsystem area.
Figure 4:
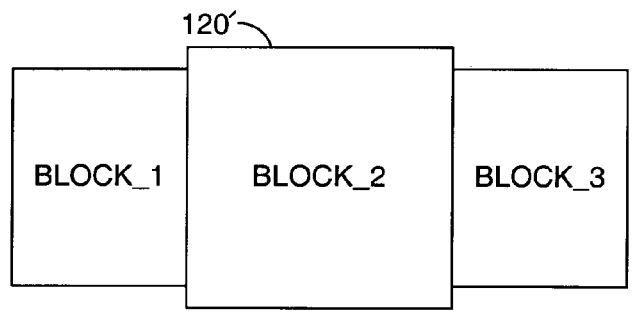

Referring to FIG. 4, a block diagram is show illustrating an effect of placement on estimated area. Connectivity may affect the average utilization coefficient between any two particular blocks. The tool may be further configured to adjust the estimated area of subsystem blocks based on placement information. For example, the tool may be configured to adjust the estimated area 120 for a subsystem block to account for changes in the utilization coefficient when the block is placed between two connected blocks.

For example, the estimated area of BLOCK_2 may have an initial value based on a gate count estimate and an initial utilization coefficient. However, when BLOCK_1 and BLOCK_3 are placed on either side of BLOCK_2, the connectivity between BLOCK_1 and BLOCK_3 may be taken into consideration to re-calculate the utilization coefficient of BLOCK_2. For example, the tool may analyze how many signals connect between BLOCK_1 and BLOCK_3. The number of signals may reduce the expected utilization in-between the two blocks. The tool may be configured to reduce the utilization coefficient of BLOCK_2 accordingly to account for the lower estimated utilization.

When there are many signals between BLOCK_1 and BLOCK_3, the utilization coefficient of BLOCK_2 is generally lower than when there are fewer such signals. The tool may be configured to increase the total area occupied by a displayed subsystem to reflect the lower utilization coefficient for the particular placement. Further rules for refining (or adjusting) the utilization coefficients of subsystems may be further developed to ensure correlation with observations in realized designs.

Figure 5:
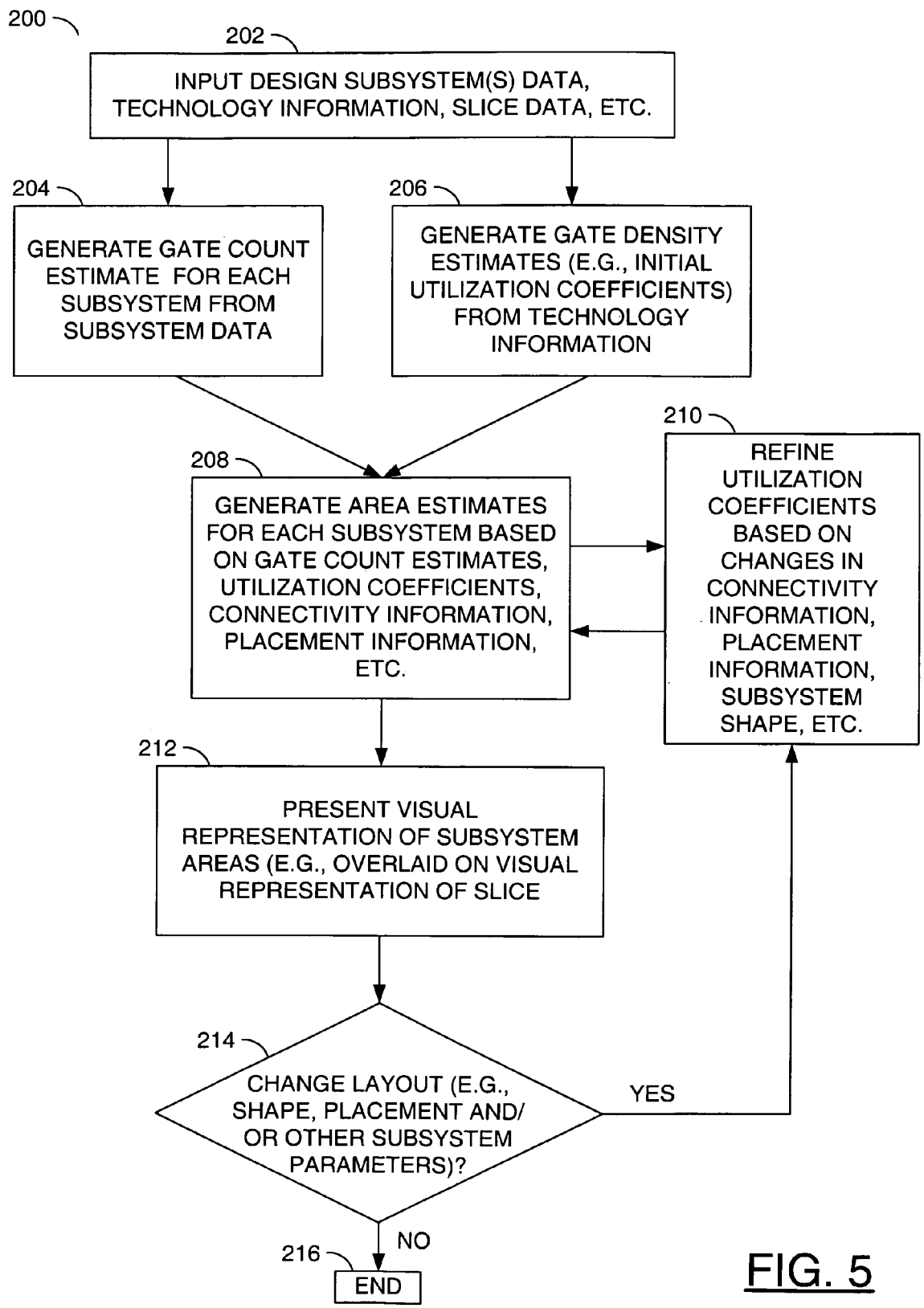
FIG. 5 is a flow diagram illustrating an example floorplan visualization process in accordance with a preferred embodiment of the present invention.

Referring to FIG. 5, a flow diagram 200 is shown illustrating a floorplan visualization process in accordance with a preferred embodiment of the present invention. The process 200 may begin with the input of design subsystem data, technology information, slice data and whatever other information may be appropriate (e.g., the block 202). The process 200 generally continues by generating (i) gate count estimates for each subsystem based on the subsystem data (e.g., the block 204) and (ii) gate density estimates (or utilization coefficients) for each subsystem of the design based on the technology information (e.g., the block 206). For example, an initial logic synthesis run may be performed to generate gate array count estimates for each subsystem of the design.

When the gate count estimates and the gate density estimates have been generated, the process 200 may continue by generating estimated areas for each of the subsystems of the design (e.g., the block 208). The estimates of subsystem area are generally determined using the gate count estimates, the gate density estimates, initial utilization coefficients for each subsystem, connectivity information with respect to each subsystem, user input and any other appropriate information. In one example, the initial utilization coefficients may be determined by default values based on experience (e.g., average values). In one example, the initial utilization coefficients may be refined (or adjusted) based on placement, connectivity, and/or other information (e.g., the block 210).

When the estimates of subsystem areas have been generated, the process 200 generally proceeds to present a visual representation of the subsystem areas. For example, the subsystem areas may be shown overlaid on a visual representation of the slice (e.g., the block 212). Based on the visual representation of the subsystem areas, the designer may modify parameters (e.g., utilization coefficients, connectivity information, slice selection, shape of presented areas, etc.). New visual representations of the subsystems may be generated. For example, when the designer makes a change (e.g., the block 214) the process 200 may refine (or adjust) the utilization coefficients for each affected subsystem (e.g., the block 210) and re-generate the area estimates (e.g., the block 208). In another example, the process 200 may be configured to automatically refine the initial utilization coefficients of each subsystem based on the initial design information received (e.g., in the block 202). When no more changes are desired, the process 200 may end (e.g., the block 216).

The present invention generally provides an ability to visually estimate the floorplan of a design using gate count estimates and gate density estimates (or utilization information). The present invention may reduce the huge amount of complex calculations involved in floorplanning with actual netlist data and actual gate area measurements.

The present invention may provide further advantages including, but not limited to: allowing placement analysis and visualization; helping with slice selection, IO assignment, diffused memory assignment, R-cell memory placement and/or firm IP placement; providing a very fast and easy design solution; allowing a designer to try many more permutations in a given amount of time than would be possible with a full layout tool; allowing layout analysis very early on in a design flow; providing a solution that is easy to implement; providing a solution that may be offered for free as a value added part of a design tool suite for a programmable platform device. In one example, it may be possible to use the placement information to provide a guide file for physical synthesis placement of the logic.

The function performed by the flow diagram of FIG. 5 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method for floorplan visualization comprising the steps of:
   receiving design information for an integrated circuit design comprising one or more subsystems;
   generating one or more gate count estimates for said one or more subsystems of said integrated circuit design;
   generating one or more gate density estimates for gates of said one or more subsystems mapped to one or more programmable areas of a programmable platform device; and
   generating a visual representation of one or more area estimations of said one or more subsystems based on said one or more gate count estimates and said one or more gate density estimates.

2. The method according to claim 1, further comprising the step of:
   overlaying said visual representation of said one or more area estimations on a visual representation of said programmable platform device.

3. The method according to claim 1, further comprising the step of:
   adjusting one or more of a position and a size of said visual representation of said one or more area estimations in response to input information.

4. The method according to claim 1, further comprising the step of:
   generating said one or more area estimations for each of said one or more subsystems based on said gate count estimates and said gate density estimates.

5. The method according to claim 1, further comprising the step of:
   adjusting said area estimations for each of said one or more subsystems based on refinement of one or more initial utilization coefficients for each subsystem area.

6. The method according to claim 1, further comprising the step of:
   adjusting said area estimations for each of said one or more subsystems based on one or more of connectivity information, shape information, and utilization information with regard to said one or more subsystems.

7. The method according to claim 1, further comprising the step of:
   adjusting one or more initial utilization coefficients for each subsystem based on one or more of connectivity information, shape information, and utilization information with regard to said one or more subsystems.

8. The method according to claim 1, further comprising the step of:
   receiving information concerning a layout change in said programmable platform device and generating a second visual representation of area estimations for each of said one or more subsystems based on said layout change.

9. The method according to claim 1, further comprising the step of:
   displaying said visual representations on a video display.

10. The method according to claim 1, further comprising the step of:
    generating a guide file for physical placement of logic based on placement information generated in response to said visual representations.

11. A computer readable medium containing computer executable instructions for performing a floorplan visualization comprising instructions for:
    receiving design information for an integrated circuit design comprising one or more subsystems;
    generating one or more gate count estimates for said one or more subsystems of said integrated circuit design;
    generating one or more gate density estimates for gates of said one or more subsystems mapped to one or more programmable areas of a programmable platform device; and
    generating a visual representation of one or more area estimations for each of said one or more subsystems based on said one or more gate count estimates and said one or more gate density estimates.

12. The computer readable medium according to claim 11, further comprising instructions for:
    overlaying said visual representation of said one or more area estimations on a visual representation of said programmable platform device.

13. The computer readable medium according to claim 11, further comprising instructions for:
    adjusting one or more of a position and a size of said visual representation of said area estimations in response to input information.

14. The computer readable medium according to claim 11, further comprising instructions for:
    generating said one or more area estimations for each of said one or more subsystems based on said gate count estimates and said gate density estimates.

15. The computer readable medium according to claim 11, further comprising instructions for:
    adjusting said area estimations for each of said one or more subsystems based on refinement of one or more utilization coefficients for each subsystem area.

16. The computer readable medium according to claim 11, further comprising instructions for:
    adjusting said area estimations for each of said one or more subsystems based on connectivity information with regard to said one or more subsystems.

17. The computer readable medium according to claim 11, further comprising instructions for:
    adjusting said area estimations for each of said one or more subsystems based on one or more of utilization coefficients, shape information, placement information and connectivity information.

18. The computer readable medium according to claim 11, further comprising instructions for:
receiving information concerning a layout change in said programmable platform device and generating a second visual representation of area estimations for each of said one or more subsystems based on said layout change.

19. The computer readable medium according to claim 11, further comprising instructions for:
displaying said visual representations on a video display.

20. The computer readable medium according to claim 11, further comprising instructions for:
generating a guide file for physical placement of logic based on placement information generated in response to said visual representations.

21. A design tool configured to:
generate one or more gate count estimates for one or more subsystems of an integrated circuit design based on subsystem data;
generate one or more gate density estimates for gates of said subsystems mapped to one or more programmable areas of a programmable platform device; and
generate a visual representation of area estimations for each of said one or more subsystems based on said one or more gate count estimates and said one or more gate density estimates.

22. The design tool according to claim 21, further configured to:
overlay said visual representation of area estimations on a visual representation of said programmable platform device.

23. The design tool according to claim 21, further configured to:
adjust a position and size of said visual representation of area estimations in response to input information.

24. The design tool according to claim 21, wherein said area estimations for each of said one or more subsystems are generated based on said gate count estimates and said gate density estimates.

25. The design tool according to claim 21, wherein said area estimations for each of said one or more subsystems are refined based on one or more utilization coefficients.

26. The design tool according to claim 21, further configured to:
receive information concerning a layout change in said programmable platform device and generating a second visual representation of area estimations for each of said one or more subsystems based on said layout change.

27. The design tool according to claim 21, wherein said area estimations for each of said one or more subsystems are refined based on connectivity information.

* * * * *